United States Patent
Yamazaki

(10) Patent No.: US 8,749,747 B2
(45) Date of Patent: *Jun. 10, 2014

(54) METHOD OF MANUFACTURING LIQUID CRYSTAL PANEL, GLASS SUBSTRATE FOR LIQUID CRYSTAL PANEL, AND LIQUID CRYSTAL PANEL INCLUDING THE SAME

(75) Inventor: Ikushi Yamazaki, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 275 days.

This patent is subject to a terminal disclaimer.

(21) Appl. No.: 13/258,493

(22) PCT Filed: Feb. 24, 2010

(86) PCT No.: PCT/JP2010/052848
§ 371 (c)(1),
(2), (4) Date: Sep. 22, 2011

(87) PCT Pub. No.: WO2010/125846
PCT Pub. Date: Nov. 4, 2010

(65) Prior Publication Data
US 2012/0026450 A1    Feb. 2, 2012

(30) Foreign Application Priority Data
Apr. 30, 2009   (JP) ................ 2009-110676

(51) Int. Cl.
G02F 1/1333 (2006.01)
G02F 1/13 (2006.01)
H01L 23/544 (2006.01)
(52) U.S. Cl.
USPC .......................... 349/158; 349/187; 257/797
(58) Field of Classification Search
USPC .................. 349/158, 110, 187, 122; 257/797, 257/E23.179
See application file for complete search history.

(56) References Cited

U.S. PATENT DOCUMENTS

| | | |
|---|---|---|
| 5,361,150 A | 11/1994 | Noguchi |
| 6,512,196 B1 | 1/2003 | Yoon et al. |

(Continued)

FOREIGN PATENT DOCUMENTS

| | | |
|---|---|---|
| EP | 1 921 490 A1 | 5/2008 |
| JP | 01-206347 A | 8/1989 |

(Continued)

OTHER PUBLICATIONS

Official Communication issued in corresponding European Patent Application No. 10769546.2, mailed on Mar. 6, 2013.

(Continued)

*Primary Examiner* — Mark Robinson
*Assistant Examiner* — Robert Tavlykaev
(74) *Attorney, Agent, or Firm* — Keating & Bennett, LLP

(57) ABSTRACT

A method of manufacturing a liquid crystal panel according to the present invention includes the steps of providing a marking pad including a marking region formed of a stack constituted only of a metal film serving as a lower layer and an ITO film serving as an upper layer on a main surface of a glass substrate, bonding a glass substrate to the glass substrate so as to be opposed to the main surface of the marking region in the marking pad at a distance therefrom, and providing marking by providing a through hole in the marking region in the marking pad by irradiating the marking region in the marking pad with laser beams through the glass substrate. Thus, the marking pad provided on the glass substrate for the liquid crystal panel can be provided with marking of high definition even though laser beams are emitted through another glass substrate for a liquid crystal panel paired with the glass substrate for the liquid crystal panel.

8 Claims, 18 Drawing Sheets

(56) References Cited

U.S. PATENT DOCUMENTS

| | | |
|---|---|---|
| 7,629,613 B2 | 12/2009 | Sohn et al. |
| 2004/0056993 A1 | 3/2004 | Kim et al. |
| 2006/0049408 A1 | 3/2006 | Sohn et al. |

FOREIGN PATENT DOCUMENTS

| | | |
|---|---|---|
| JP | 04-077715 A | 3/1992 |
| JP | 06-051328 A | 2/1994 |
| JP | 10-278422 A | 10/1998 |
| JP | 11-109412 A | 4/1999 |
| JP | 2000-243554 A | 9/2000 |
| JP | 2006-079036 A | 3/2006 |
| WO | 2008/119949 A1 | 10/2008 |

OTHER PUBLICATIONS

Official Communication issued in International Patent Application No. PCT/JP2010/052848, mailed on May 18, 2010.

Yamazaki, "Method of Manufacturing Liquid Crystal Panel, Glass Substrate for Liquid Crystal Panel, and Liquid Crystal Panel Including the Same," U.S. Appl. No. 13/258,540, filed Sep. 22, 2011.

Hayakawa, "A Laser Method for Marking Bar Codes on Glass Substrates," First International Symposium on Laser Precision Microfabrication, Proceedings of SPIE, vol. 4088, 2000, pp. 363-366.

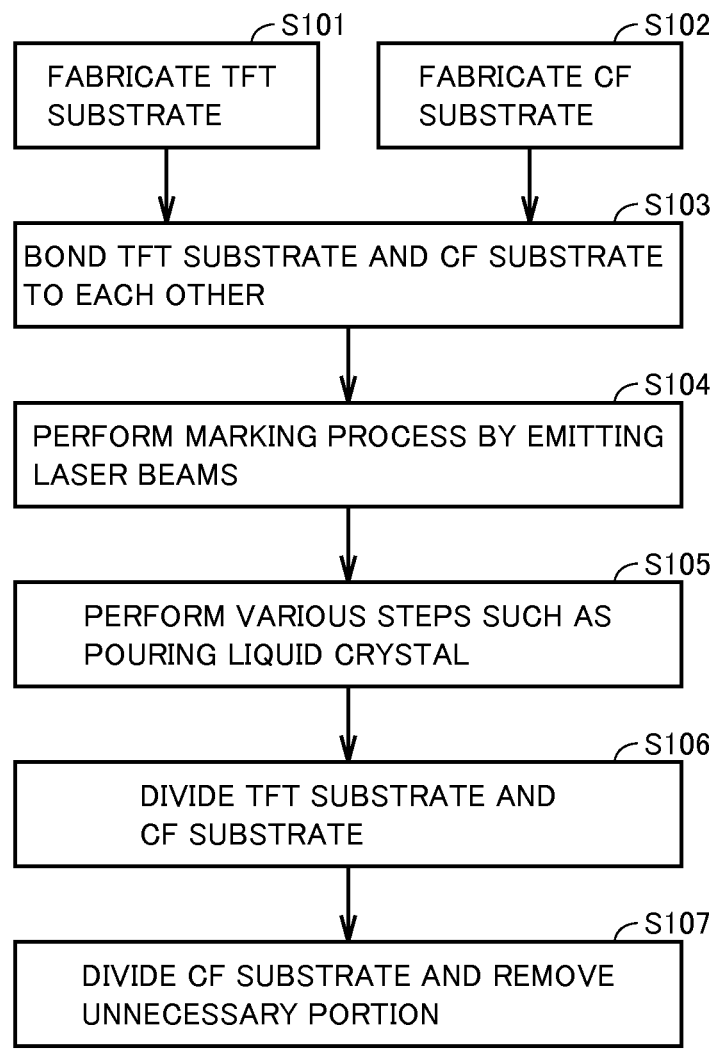

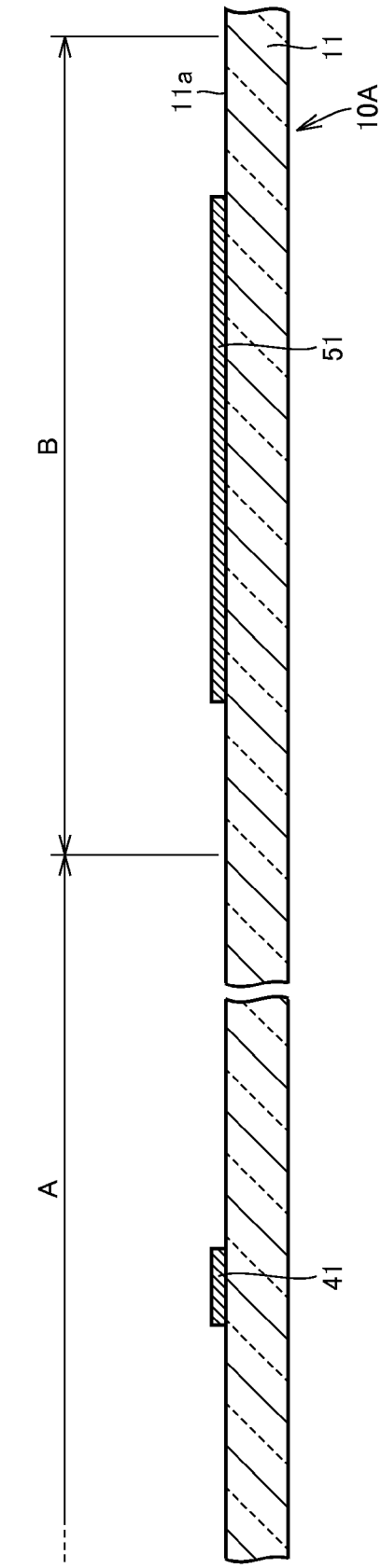

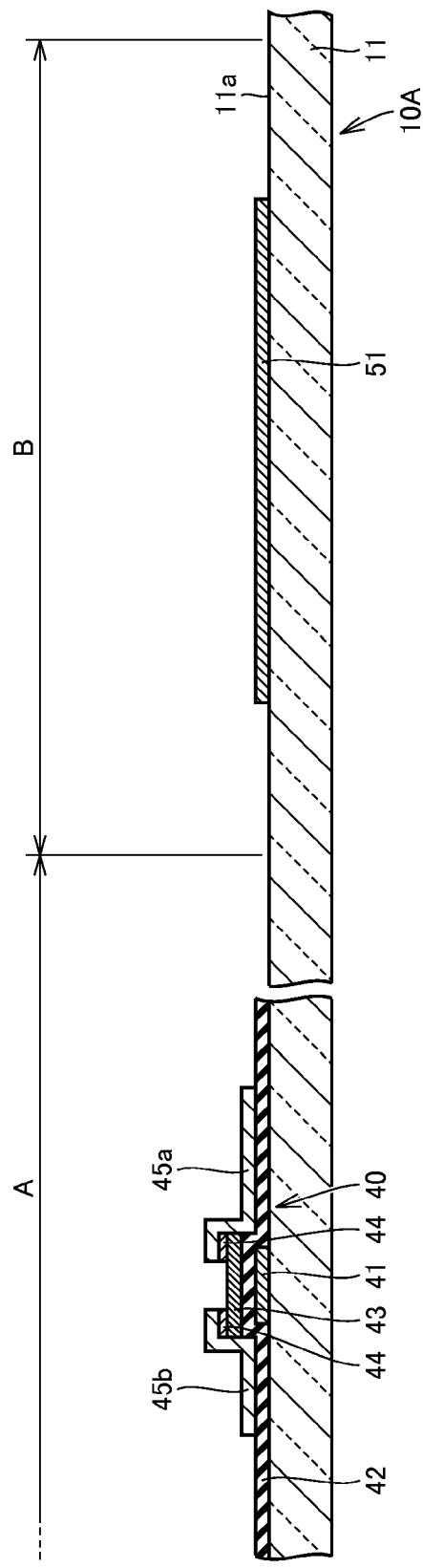

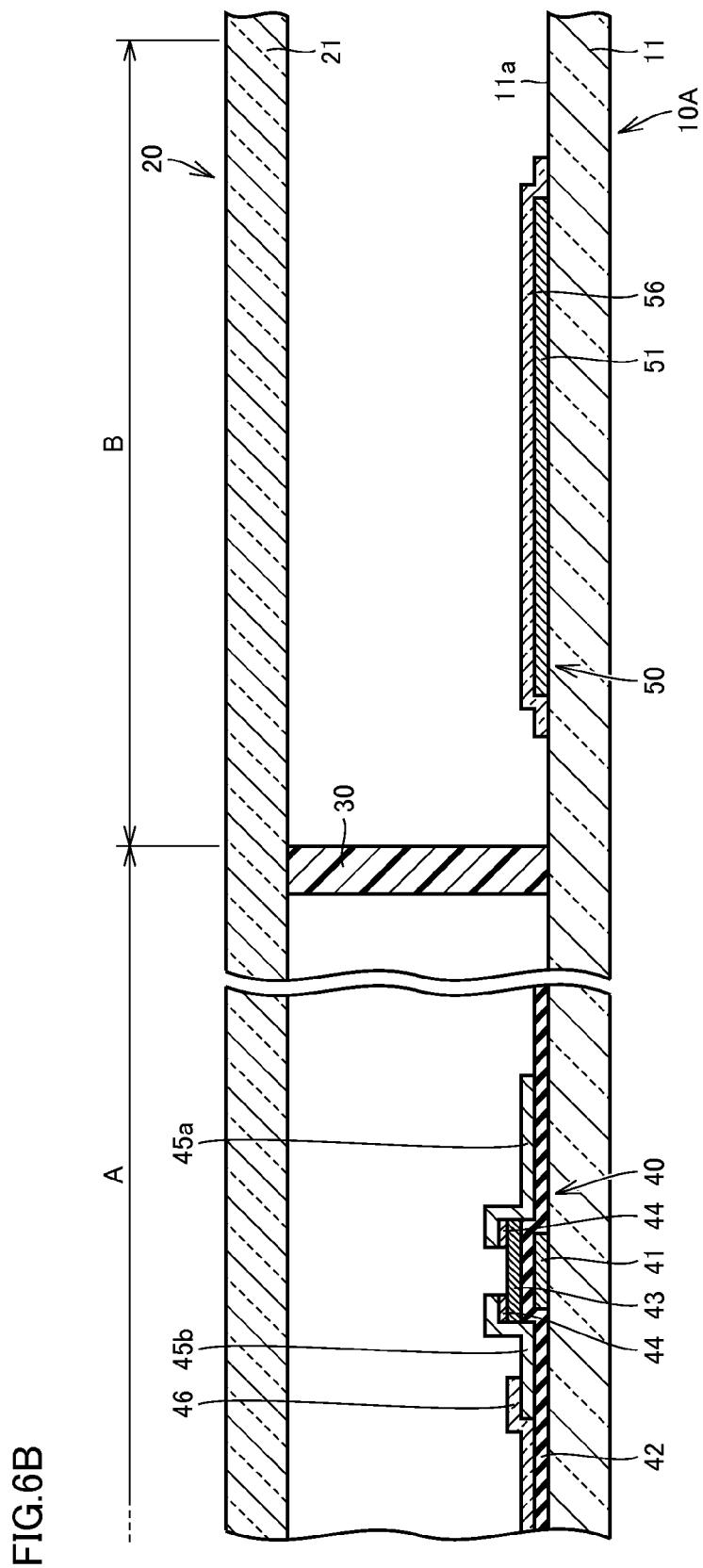

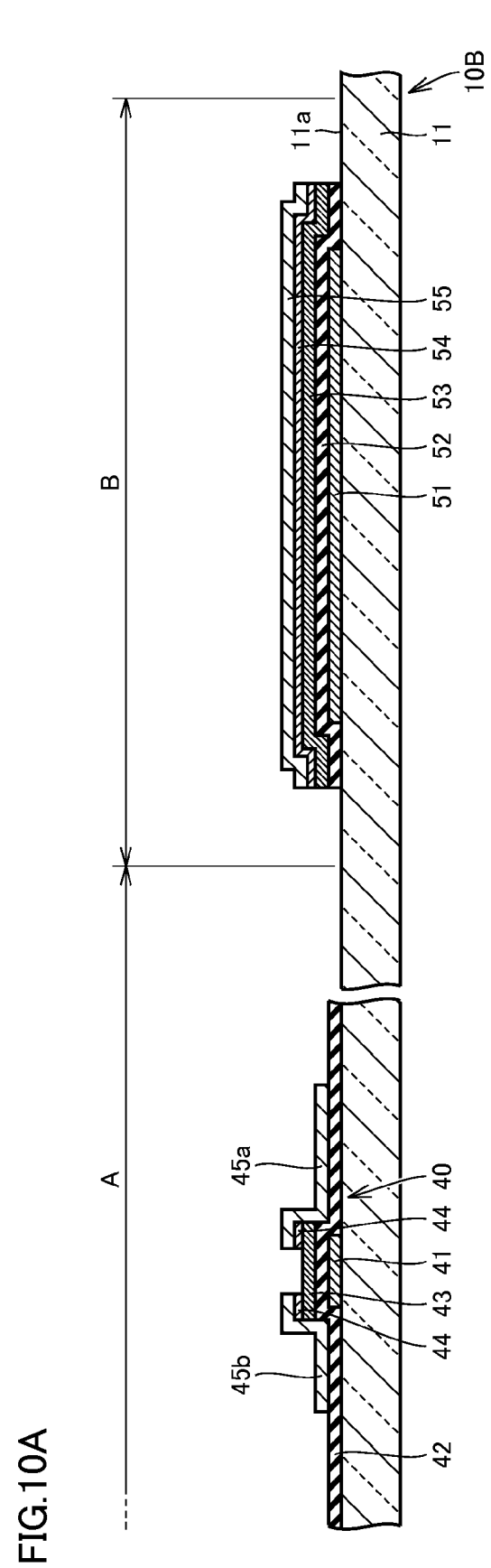

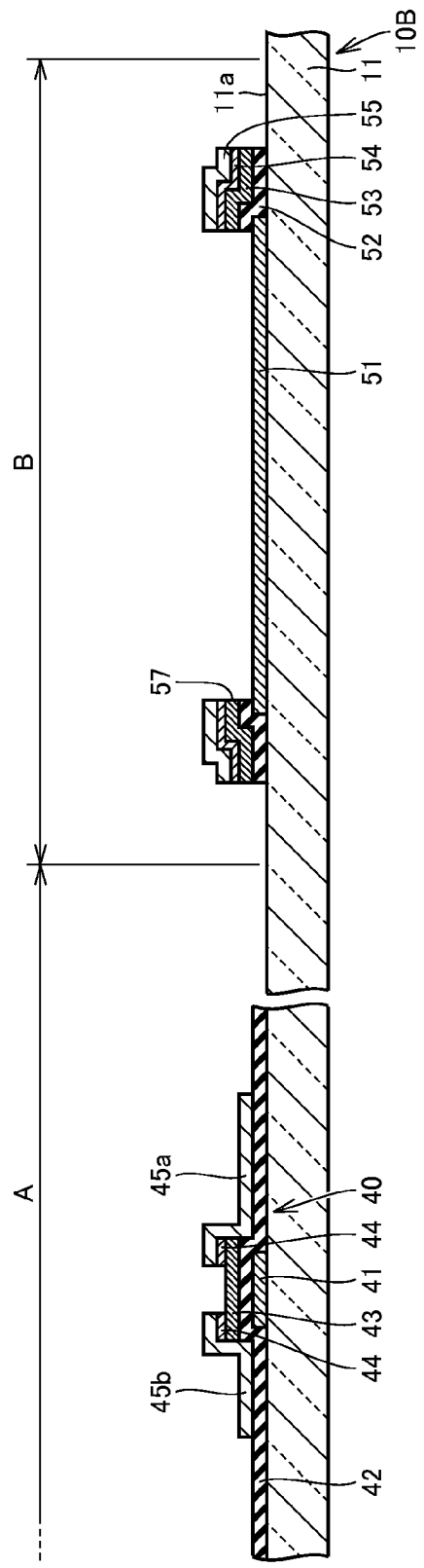

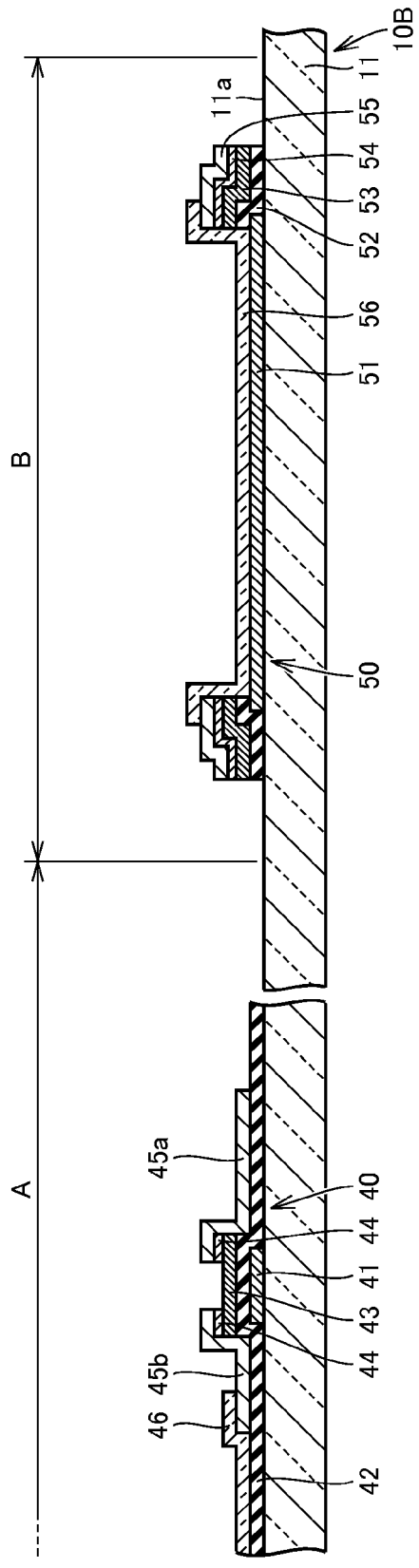

METHOD OF MANUFACTURING LIQUID CRYSTAL PANEL, GLASS SUBSTRATE FOR LIQUID CRYSTAL PANEL, AND LIQUID CRYSTAL PANEL INCLUDING THE SAME

TECHNICAL FIELD

The present invention relates to a method of manufacturing a liquid crystal panel including the step of marking through laser marking, various types of information in a marking pad provided on a glass substrate for the liquid crystal panel, and also to a glass substrate for a liquid crystal panel including a marking pad having a marking region suitable for laser marking as well as a liquid crystal panel including the same.

BACKGROUND ART

In general, a liquid crystal panel is suitably used in a display for a liquid crystal television or a personal computer serving as a display apparatus, and it has remarkably widely been used in recent years. In the liquid crystal panel, out of necessity in management during production or necessity in maintenance after shipment, various types of information such as serial information and information on use thereof are marked. Laser marking is normally suitably utilized for this marking, and the various types of information described above are marked during a production process by irradiating a glass substrate for a liquid crystal panel, which is a component of the liquid crystal panel, with laser beams.

As a method of marking various types of information in a glass substrate for a liquid crystal panel by utilizing laser marking, for example, a marking method by irradiating an ITO (Indium Thin Oxide) film formed on a surface of a glass substrate with laser beams (see Japanese Patent Laying-Open No. 6-51328 (Patent Literature 1)), a marking method by irradiating an orientation film formed on a surface of a glass substrate with laser beams (see Japanese Patent Laying-Open No. 10-278422 (Patent Literature 2)), a marking method by irradiating a metal film formed on a surface of a glass substrate with laser beams, and the like have been known.

Among these, in the marking method by irradiating a metal film formed on a surface of a glass substrate with laser beams, specifically, marking is provided in the glass substrate by providing a marking pad by forming a metal film in a peripheral portion of the glass substrate not serving as a liquid crystal display portion, irradiating this marking pad with laser beams, and thus forming a through hole in the marking pad. It is noted that various types of information thus marked are marked in the glass substrate as a two-dimensional data code with the information being data-matrixed, and the information is read by using any of a reflection camera and a transmission camera.

CITATION LIST

Patent Literature

PTL 1: Japanese Patent Laying-Open No. 6-51328
PTL 2: Japanese Patent Laying-Open No. 10-278422

SUMMARY OF INVENTION

Technical Problem

The following two types are assumed as process flows in a case where marking is provided by irradiating a metal film formed on a glass substrate for a liquid crystal panel with laser beams. The first process flow is called a single-substrate process, and it is a process flow in which, prior to bonding between a TFT (Thin Film Transistor) substrate which is a glass substrate to be provided with marking and a CF (Color Filter) substrate to which a color filter has been bonded, various types of information are marked by directly irradiating a marking pad provided on the TFT substrate with laser beams and thereafter the TFT substrate and the CF substrate are bonded to each other. The second process flow is called a multiple-substrate process, and it is a process flow in which, after the TFT substrate and the CF substrate are bonded to each other, various types of information are marked by irradiating the marking pad provided on the TFT substrate with laser beams through the CF substrate.

In adopting the single-substrate process described above, since the marking pad is directly irradiated with laser beams, definition of formed marking (that is, a shape or a size of a through hole, a degree of darkening around the through hole, and the like) can be suited for reading with the use of a transmission camera or a reflection camera.

On the other hand, however, in the single-substrate process, since a laser marking process is required before bonding between the TFT substrate and the CF substrate, a cycle time required for production of TFT substrates becomes longer and significant unbalance between the number of produced TFT substrates per unit time and the number of produced CF substrates per unit time is caused. In order to overcome this problem, it is necessary either to add new production facilities for increasing the number of produced TFT substrates per unit time or to adapt to a speed of production of TFT substrates by intentionally decreasing a speed of production of CF substrates, which leads to increase in production cost and necessity for inefficient production adjustment.

Meanwhile, in adopting the multiple-substrate process described above, since the marking pad provided on the TFT substrate is irradiated with laser beams through the CF substrate, definition of formed marking is lower than in the single-substrate process described above and reading error may occur during reading with a transmission camera or a reflection camera.

In adopting the multiple-substrate process, however, since the laser marking process is performed after bonding between the TFT substrate and the CF substrate, unbalance in the number of produced TFT substrates and CF substrates described above is less likely and an effect of enabling efficient manufacturing of liquid crystal panels is achieved.

Therefore, if the multiple-substrate process described above is adopted and yet definition of formed marking could be improved, efficient production of liquid crystal panels and reduction in cost can both simultaneously be achieved.

Then, an object of the present invention is to provide a method of manufacturing a liquid crystal panel allowing for providing marking of high definition even in a case where a marking pad provided on a glass substrate for a liquid crystal panel is irradiated with laser beams through another glass substrate for a liquid crystal panel paired with the glass substrate for a liquid crystal panel.

In addition, an object of the present invention is to provide a glass substrate for a liquid crystal panel including a marking pad suited for a laser marking process and a liquid crystal panel.

Solution to Problem

A method of manufacturing a liquid crystal panel according to the present invention includes the following steps (A) to (D):

(A) Preparing a first liquid crystal panel glass substrate including a portion serving as a liquid crystal display portion and a peripheral portion not serving as the liquid crystal display portion;

(B) Providing a marking pad including a marking region formed of a stack constituted only of a metal film and an ITO film on a main surface of the peripheral portion of the first liquid crystal panel glass substrate;

(C) Bonding a second liquid crystal panel glass substrate paired with the first liquid crystal panel glass substrate to the first liquid crystal panel glass substrate so as to be opposed to a main surface of the marking region in the marking pad at a distance therefrom; and (D) Providing marking by providing a through hole penetrating the ITO film and the metal film in the marking region in the marking pad by irradiating the marking region in the marking pad with laser beams through the second liquid crystal panel glass substrate.

In the method of manufacturing a liquid crystal panel according to the present invention, the step of (B) providing a marking pad described above may include the following steps (a) and (b):

(a) Forming the metal film on the main surface of the peripheral portion of the first liquid crystal panel glass substrate; and (b) Forming the ITO film in contact with the metal film so as to cover a main surface and a periphery of the metal film.

In the method of manufacturing a liquid crystal panel according to the present invention, the step of (B) providing a marking pad described above may include the following steps (a) and (c) to (e):

(a) Forming the metal film on the main surface of the peripheral portion of the first liquid crystal panel glass substrate;

(c) Forming an insulating film in contact with the metal film so as to cover a main surface and a periphery of the metal film;

(d) Removing a part of the insulating film such that the main surface of the metal film is exposed and the periphery of the metal film is covered with the insulating film; and (e) Forming the ITO film in contact with the metal film so as to cover the main surface of the metal film exposed as a result of removal of the part of the insulating film.

In the method of manufacturing a liquid crystal panel according to the present invention, in the step of (c) forming an insulating film in the step of (B) providing a marking pad described above, an insulating film serving as a gate insulating film of a TFT is preferably simultaneously formed in the portion serving as the liquid crystal display portion of the first liquid crystal panel glass substrate.

In the method of manufacturing a liquid crystal panel according to the present invention, in the step of (a) forming the metal film in the step of (B) providing a marking pad described above, a metal film serving as a gate electrode of a TFT is preferably simultaneously formed in the portion serving as the liquid crystal display portion of the first liquid crystal panel glass substrate.

In the method of manufacturing a liquid crystal panel according to the present invention, in the step of (b) or (e) forming the ITO film in the step of (B) providing a marking pad described above, an ITO film serving as a pixel electrode is preferably simultaneously formed in the portion serving as the liquid crystal display portion of the first liquid crystal panel glass substrate.

In the method of manufacturing a liquid crystal panel according to the present invention, the step of (a) forming the metal film in the step of (B) providing a marking pad described above may include the step of successively stacking and forming a plurality of films different in material.

The method of manufacturing a liquid crystal panel according to the present invention may further include the step of (E) subjecting a surface of the metal film serving as the marking region in the marking pad to anodization treatment.

A glass substrate for a liquid crystal panel according to the present invention including a portion serving as a liquid crystal display portion and a peripheral portion not serving as the liquid crystal display portion, includes a marking pad on a main surface of the peripheral portion, for providing marking by irradiation with laser beams, and the marking pad includes a marking region formed of a stack constituted only of a metal film and an ITO film.

In the glass substrate for a liquid crystal panel according to the present invention, a main surface and a periphery of the metal film constituting the marking region in the marking pad may be covered with the ITO film constituting the marking region in the marking pad.

In the glass substrate for a liquid crystal panel according to the present invention, a periphery of the metal film constituting the marking region in the marking pad may be covered with an insulating film.

In the glass substrate for a liquid crystal panel according to the present invention, a TFT may be provided on a main surface of the portion serving as the liquid crystal display portion, and in that case, the insulating film covering the periphery of the metal film constituting the marking region in the marking pad and an insulating film constituting a gate insulating film of the TFT are preferably simultaneously formed in a single step.

In the glass substrate for a liquid crystal panel according to the present invention, a TFT may be provided on a main surface of the portion serving as the liquid crystal display portion, and in that case, the metal film constituting the marking region in the marking pad and a metal film constituting a gate electrode of the TFT are preferably simultaneously formed in a single step.

In the glass substrate for a liquid crystal panel according to the present invention, a TFT may be provided on a main surface of the portion serving as the liquid crystal display portion, and in that case, the ITO film constituting the marking region in the marking pad and an ITO film constituting the pixel electrode are preferably simultaneously formed in a single step.

In the glass substrate for a liquid crystal panel according to the present invention, the metal film constituting the marking region in the marking pad may be made of a film stack of a plurality of films different in material.

In the glass substrate for a liquid crystal panel according to the present invention, a surface of the metal film constituting the marking region in the marking pad may be subjected to anodization treatment.

A liquid crystal panel according to the present invention includes any glass substrate for a liquid crystal panel described above.

Advantageous Effects of Invention

According to the present invention, a method of manufacturing a liquid crystal panel allowing for providing marking of high definition even in a case where a marking pad provided on a glass substrate for a liquid crystal panel is irradiated with laser beams through another glass substrate for a liquid crystal panel paired with the glass substrate for a liquid crystal panel can be provided.

In addition, according to the present invention, a glass substrate for a liquid crystal panel including a marking pad suited for a laser marking process and a liquid crystal panel can be provided.

BRIEF DESCRIPTION OF DRAWINGS

FIG. 4 is a flowchart for illustrating a method of manufacturing a liquid crystal panel in the first embodiment of the present invention.

FIG. 5A is a schematic cross-sectional view in a production process in a case where a liquid crystal panel is manufactured according to the method of manufacturing a liquid crystal panel in the first embodiment of the present invention.

FIG. 5B is a schematic cross-sectional view in the production process in a case where a liquid crystal panel is manufactured according to the method of manufacturing a liquid crystal panel in the first embodiment of the present invention.

FIG. 6B is a schematic cross-sectional view in the production process in a case where a liquid crystal panel is manufactured according to the method of manufacturing a liquid crystal panel in the first embodiment of the present invention.

FIG. 10A is a schematic cross-sectional view in the production process in a case where a liquid crystal panel is manufactured according to the method of manufacturing a liquid crystal panel in the second embodiment of the present invention.

FIG. 10B is a schematic cross-sectional view in the production process in a case where a liquid crystal panel is manufactured according to the method of manufacturing a liquid crystal panel in the second embodiment of the present invention.

FIG. 11A is a schematic cross-sectional view in the production process in a case where a liquid crystal panel is manufactured according to the method of manufacturing a liquid crystal panel in the second embodiment of the present invention.

DESCRIPTION OF EMBODIMENTS

Figure 1:
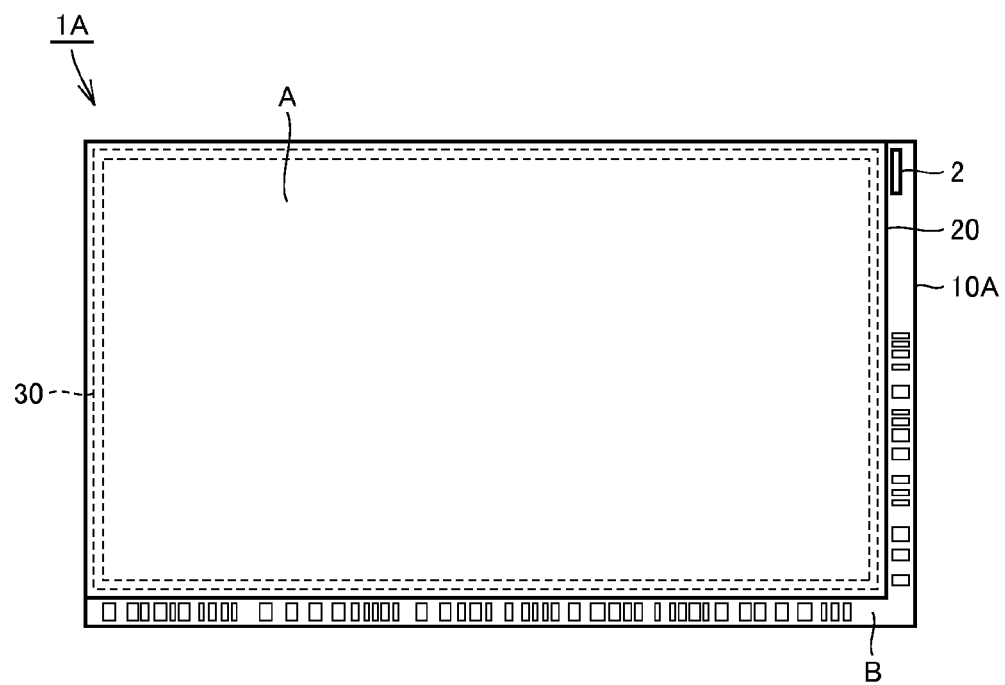
FIG. 1 is a schematic plan view of a liquid crystal panel in a first embodiment of the present invention.

An embodiment of the present invention will be described hereinafter in detail with reference to the drawings. In the embodiment and a variation thereof shown below, the same elements have the same reference characters allotted and description thereof will not be repeated.

First Embodiment

Figure 2:
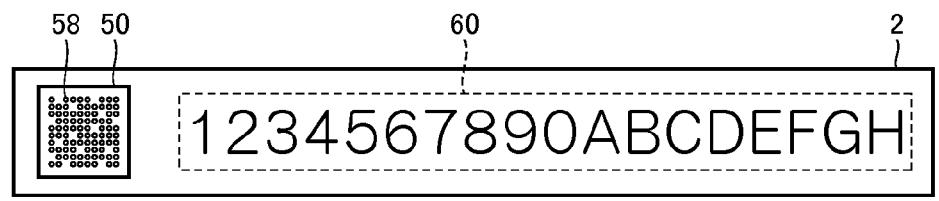
FIG. 2 is an enlarged schematic diagram of an information recording portion shown in FIG. 1.
Figure 3:
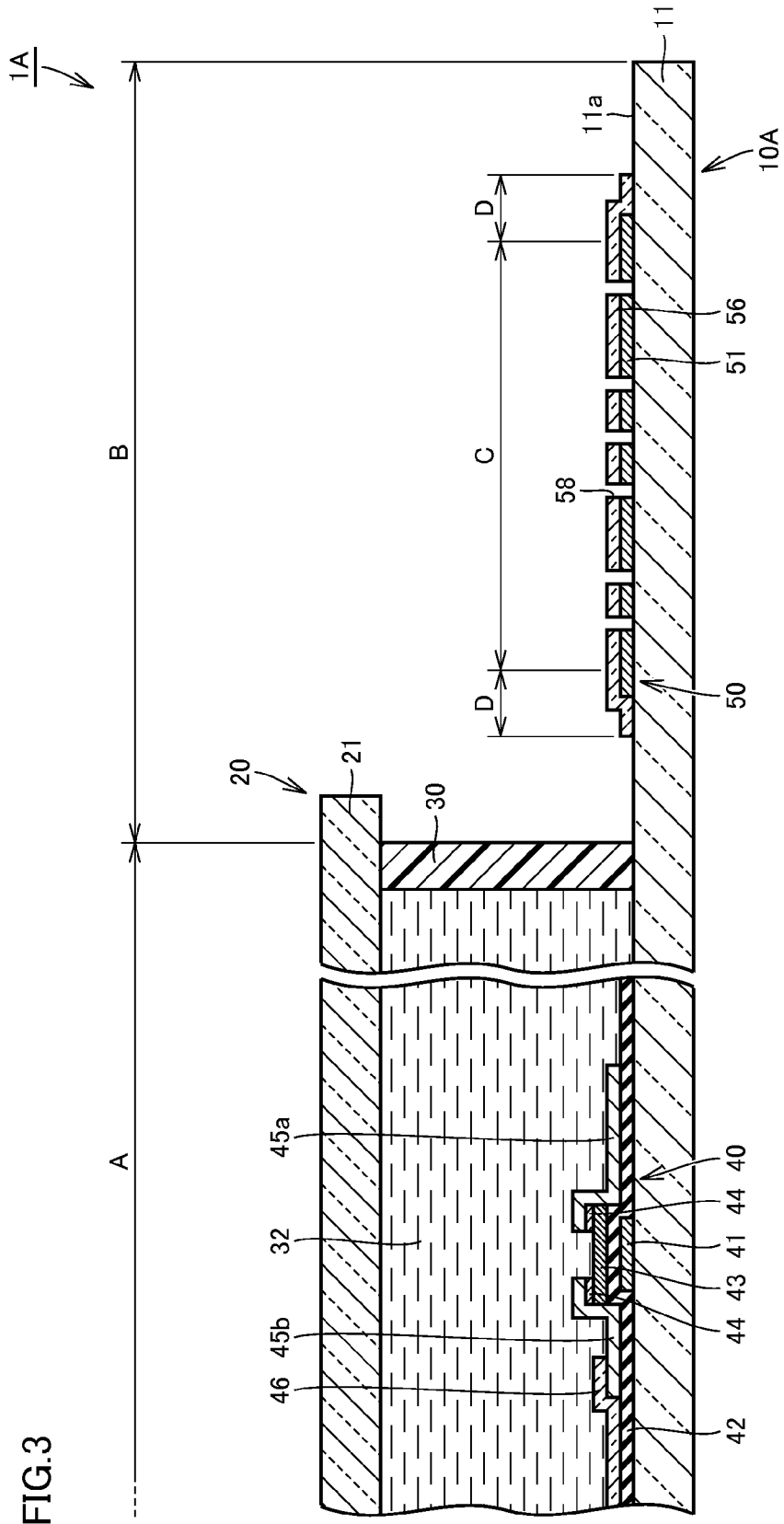
FIG. 3 is a schematic cross-sectional view of the liquid crystal panel in the first embodiment of the present invention.

FIG. 1 is a schematic plan view of a liquid crystal panel in a first embodiment of the present invention, and FIG. 2 is an enlarged schematic diagram of an information recording portion of the liquid crystal panel shown in FIG. 1. FIG. 3 is a schematic cross-sectional view of the liquid crystal panel shown in FIG. 1. Initially, a structure of a liquid crystal panel and a glass substrate for a liquid crystal panel in the present embodiment will be described with reference to these FIGS. 1 to 3.

As shown in FIGS. 1 and 3, a liquid crystal panel 1A in the present embodiment mainly includes a TFT substrate 10A, a CF substrate 20, a sealing member 30, and a liquid crystal 32. Liquid crystal panel 1A in the present embodiment is what is called an active-matrix-type liquid crystal panel in which a plurality of display pixels arranged in matrix are individually controlled by TFTs provided for the display pixels.

TFT substrate 10A is also called an active matrix substrate, and it mainly has a glass substrate 11 serving as a base member, a plurality of TFTs 40 formed on a main surface 11a thereof, and a plurality of pixel electrodes 46 electrically connected to respective TFTs 40. TFT substrate 10A includes therein a portion A serving as a liquid crystal display portion for displaying an image and a peripheral portion B not serving as the liquid crystal display portion, and the plurality of TFTs 40 and pixel electrodes 46 described above are arranged in matrix in portion A serving as the liquid crystal display portion. It is noted that TFT substrate 10A (in some cases, glass substrate 11 serving as a base member for TFT substrate 10A) corresponds to a first liquid crystal panel glass substrate.

CF substrate 20 is also called an opposing substrate, and it mainly has a glass substrate 21 serving as a base member, a color filter (not shown) bonded to a main surface thereof, and a counter electrode (not shown) formed on the color filter. CF substrate 20 has only a portion serving as the liquid crystal display portion. The color filter is bonded to the portion of glass substrate 21 to serve as the liquid crystal display portion, and a plurality of counter electrodes described above are arranged in matrix on a main surface of the color filter. It is noted that this CF substrate 20 (in some cases, glass substrate 21 serving as a base member for CF substrate 20) corresponds to a second liquid crystal panel glass substrate.

TFT substrate 10A and CF substrate 20 are bonded to each other by sealing member 30 such that they are opposed to each other at a prescribed distance (for example, approximately 5 μm). Sealing member 30 is provided to surround the liquid crystal display portion, and liquid crystal 32 is sealed in a space surrounded by this sealing member 30 and lying between TFT substrate 10A and CF substrate 20. Liquid crystal 32 has such a characteristic that its transmittance of light varies in accordance with an applied voltage, and it is located between pixel electrode 46 provided on TFT substrate 10A described above and the counter electrode provided on CF substrate 20 described above. It is noted that a not-shown orientation film is provided in a portion of TFT substrate 10A and CF substrate 20 facing liquid crystal 32.

At a prescribed position in peripheral portion B of TFT substrate 10A not serving as the liquid crystal display portion, an information recording portion 2 where various types of information are recorded is provided. As shown in FIG. 2, information recording portion 2 includes a marking pad 50 where various types of information are recorded in a form of a two-dimensional data code and a character data portion 60 where various types of information are recorded as character data. Out of them, in marking pad 50 where various types of information are recorded in the form of a two-dimensional data code, information is recorded as a through hole 58 provided in marking pad 50 by performing a laser marking process which will be described later.

As shown in FIG. 3, in portion A of TFT substrate 10A serving as the liquid crystal display portion, TFT 40 is provided on main surface 11a of glass substrate 11. TFT 40 has a gate electrode 41 electrically connected to a gate interconnection, a gate insulating film 42 formed to cover gate electrode 41, a first semiconductor layer 43 formed on gate electrode 41 with gate insulating film 42 being interposed, a second semiconductor layer 44 formed at a prescribed position on first semiconductor layer 43, and a source electrode 45a and a drain electrode 45b formed on second semiconductor layer 44.

Gate electrode 41 is formed from a single-layer metal film made, for example, of aluminum (Al), copper (Cu), tantalum (Ta), titanium (Ti), or the like. In addition, gate insulating film 42 is formed from a single-layer or multiple-layer insulating film made of silicon nitride (SiNx), silicon oxide (SiOx) or the like.

First semiconductor layer 43 is formed from an intrinsic semiconductor film made, for example, of amorphous silicon. In addition, second semiconductor layer 44 is formed from an impurity-added semiconductor film made, for example, of $n^+$ type amorphous silicon. It is noted that second semiconductor layer 44 functions as a contact layer between first semiconductor layer 43 and source electrode 45a and between first semiconductor layer 43 and drain electrode 45b.

Source electrode 45a and drain electrode 45b are formed from a single-layer or multiple-layer metal film made, for example, of aluminum, copper, tantalum, titanium, or the like. In addition, pixel electrode 46 is formed, for example, from an ITO film (that is, a mixed film of indium oxide ($In_2O_3$) and tin oxide ($SnO_2$)).

Meanwhile, in peripheral portion B of TFT substrate 10A not serving as the liquid crystal display portion, marking pad 50 is provided on main surface 11a of glass substrate 11. Marking pad 50 has a marking region C in which marking is provided and a peripheral region D surrounding marking region C. Marking region C in marking pad 50 is formed of a stack constituted only of a metal film serving as a lower layer 51 and an ITO film serving as an upper layer 56, and a periphery of the metal film serving as lower layer 51 is covered with the ITO film serving as upper layer 56 in peripheral region D.

The metal film serving as lower layer 51 is formed from a single-layer metal film made, for example, of aluminum, copper, tantalum, titanium, or the like. The main surface of the metal film serving as lower layer 51 (that is, a surface in contact with upper layer 56) may be subjected to anodization treatment. It is noted that lower layer 51 in marking region C in marking pad 50 and gate electrode 41 of TFT 40 described above are preferably simultaneously formed, and in that case, the metal film forming gate electrode 41 of TFT 40 and the metal film forming lower layer 51 in marking pad 50 are formed of the same material to the same thickness.

Upper layer 56 in marking region C in marking pad 50 and the pixel electrode connected to TFT 40 described above are preferably simultaneously formed, and in that case, the ITO film forming pixel electrode 46 connected to TFT 40 and the ITO film forming upper layer 56 in marking pad 50 are formed of the same material to the same thickness.

Here, in marking region C in marking pad 50, a plurality of through holes 58 penetrating the ITO film serving as upper layer 56 and the metal film serving as lower layer 51 are provided. This through hole 58 implements a two-dimensional data code in which various types of information such as serial information and information on use have been coded and the information is read by using a transmission camera or a reflection camera.

Specifically, in a case where a transmission camera is used, various types of information are read by detecting light that passes through TFT substrate 10A as it passes through through hole 58 provided in marking region C in marking pad 50. On the other hand, in a case where a reflection camera is used, various types of information are read by detecting through hole 58 provided in marking region C in marking pad 50 and darkening produced therearound in distinction from a surrounding ground by making use of difference in contrast.

FIG. 4 is a flowchart for illustrating a method of manufacturing a liquid crystal panel in the present embodiment, and FIGS. 5A to 7 are schematic cross-sectional views in a production process in a case where a liquid crystal panel is manufactured according to the method of manufacturing a liquid crystal panel in the present embodiment. A method of manufacturing a liquid crystal panel in the present embodiment will now be described with reference to these FIGS. 4 to 7.

As shown in FIG. 4, in the method of manufacturing a liquid crystal panel in the present embodiment, initially, fabrication of TFT substrate 10A (step S101) and fabrication of CF substrate 20 paired with TFT substrate 10A (step S102) are concurrently performed. In fabricating CF substrate 20, it is fabricated by preparing glass substrate 21, bonding a color film thereto and forming counter electrodes, and further forming an orientation film. In fabricating TFT substrate 10A, specifically, the following process is performed. It is noted that, in a technique for fabricating TFT substrate 10A shown below, TFT 40 and pixel electrode 46 as well as marking pad 50 are formed simultaneously by making the best use of common steps.

Initially, as shown in FIG. 5A, glass substrate 11 including portion A serving as the liquid crystal display portion and peripheral portion B not serving as the liquid crystal display portion is prepared and a metal film is formed thereon and patterned. Thus, gate electrode 41 of TFT 40 is formed in portion A serving as the liquid crystal display portion and lower layer 51 in marking pad 50 is formed in peripheral portion B. More specifically, an aluminum film is formed on main surface 11a of glass substrate 11, for example, with sputtering, and the aluminum film is patterned with photolithography to thereby form gate electrode 41 and lower layer 51. It is noted that dry etching using, for example, $BCl_3+Cl_2$, $CF_4(+O_2)$ or the like can be made use of as an etching process in photolithography. Here, the main surface of the formed aluminum film may be subjected to anodization treatment as required.

Then, as shown in FIG. 5B, an insulating film is formed on main surface 11a of portion A of glass substrate 11 serving as the liquid crystal display portion and patterned. Thus, gate insulating film 42 of TFT 40 is formed in portion A serving as the liquid crystal display portion. More specifically, a silicon nitride film is formed on main surface 11a of portion A of glass substrate 11 serving as the liquid crystal display portion, for example, with PECVD (Plasma Enhanced Chemical Vapor Deposition), and the silicon nitride film is patterned with photolithography to thereby form gate insulating film 42.

Then, as shown in FIG. 5B, an amorphous silicon layer is formed on main surface 11a of portion A of glass substrate 11 serving as the liquid crystal display portion and patterned or the like. Thus, first semiconductor layer 43 and second semiconductor layer 44 are formed in portion A serving as the liquid crystal display portion. Here, formed second semiconductor layer 44 is in such a shape as covering the entire main surface of first semiconductor layer 43, and it is formed by implanting ions into an upper portion of the amorphous silicon layer by making use of an ion implantation method as appropriate. It is noted that dry etching using, for example, $CF_4+O_2$, $CCl_4+O_2$, $SF_6$, or the like can be made use of as an etching process in patterning.

Then, as shown in FIG. 5B, a metal film is formed on main surface 11a of portion A of glass substrate 11 serving as the liquid crystal display portion and patterned. Thus, source electrode 45a and drain electrode 45b of TFT 40 are formed in portion A serving as the liquid crystal display portion. More specifically, an aluminum film is formed on main surface 11a of glass substrate 11 serving as the liquid crystal display portion, for example, with sputtering, and the aluminum film is patterned with photolithography to thereby form source electrode 45a and drain electrode 45b. It is noted that dry etching using, for example, $BCl_3+Cl_2$, $CF_4(+O_2)$ or the like can be made use of as an etching process in photolithography.

Then, as shown in FIG. 5B, using source electrode 45a and drain electrode 45b as a mask, second semiconductor layer 44 is etched and patterned, so that a channel portion is formed in first semiconductor layer 43. It is noted that dry etching using, for example, $CF_4+O_2$, $CCl_4+O_2$, $SF_6$, or the like can be made use of as an etching process in patterning.

Figure 6A:
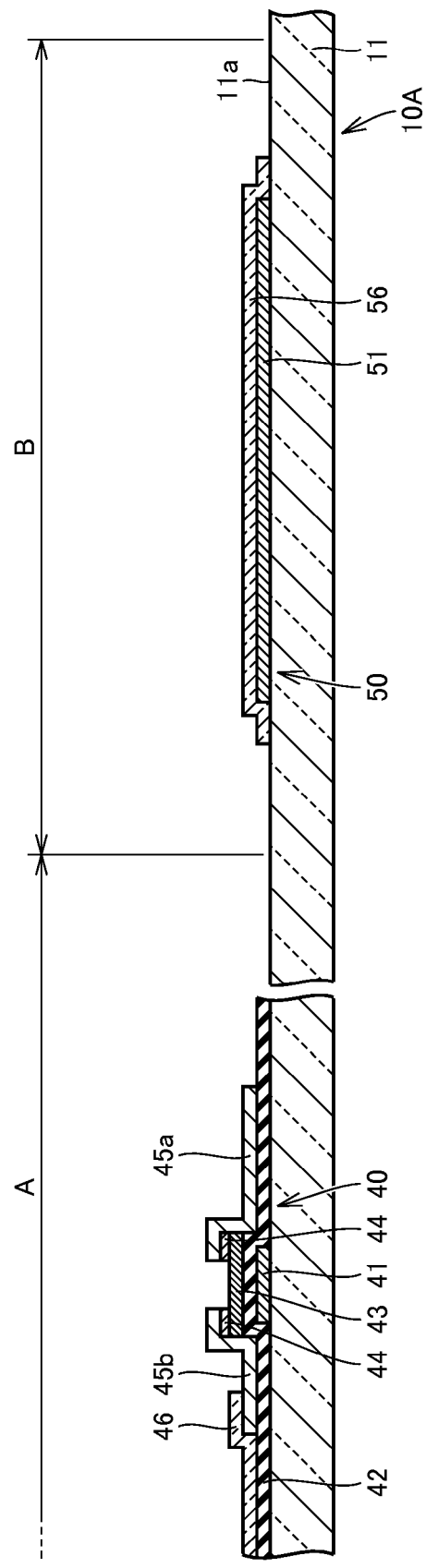
FIG. 6A is a schematic cross-sectional view in the production process in a case where a liquid crystal panel is manufactured according to the method of manufacturing a liquid crystal panel in the first embodiment of the present invention.

Then, as shown in FIG. 6A, an ITO film is formed on main surface 11a of glass substrate 11 and patterned, so that pixel electrode 46 electrically connected to TFT 40 is formed in portion A serving as the liquid crystal display portion and upper layer 56 in marking pad 50 is formed in peripheral portion B. More specifically, the ITO film is formed on glass substrate 11, for example, with sputtering, and the ITO film is patterned with photolithography to thereby form pixel electrode 46 and upper layer 56. It is noted that wet etching using, for example, $HCl+HNO_3$ or the like can be made use of as an etching process in photolithography.

Thereafter, an orientation film is formed on main surface 11a of portion A of glass substrate 11 serving as the liquid crystal display portion. Fabrication of TFT substrate 10A is completed as above.

In succession, as shown in FIG. 4, TFT substrate 10A fabricated in step S101 and CF substrate 20 fabricated in step S102 are bonded to each other (step S103). Specifically, as shown in FIG. 6B, sealing member 30 is arranged to surround portion A of TFT substrate 10A to serve as the liquid crystal display portion, CF substrate 20 is positioned in contact with this sealing member 30 to be arranged opposed to TFT substrate 10A, and sealing member 30 is cured. Thus, TFT substrate 10A and CF substrate 20 are bonded to each other. Here, a thermosetting sealing material, a photo-curing sealing material, combination thereof, or the like can be made use of as sealing member 30 to be used.

In the method of manufacturing a liquid crystal panel in the present embodiment, both of glass substrate 11 serving as a base member for TFT substrate 10A and glass substrate 21 serving as a base member for CF substrate 20 are fabricated from a mother glass substrate. Therefore, after CF substrate 20 is bonded to TFT substrate 10A, a portion of CF substrate 20 not serving as the liquid crystal display portion is located opposed to peripheral portion B of TFT substrate 10A not serving as the liquid crystal display portion. Namely, CF substrate 20 is arranged opposed to the main surface of marking region C in marking pad 50 formed in peripheral portion B of TFT substrate 10A not serving as the liquid crystal display portion, at a distance therefrom.

Figure 7:
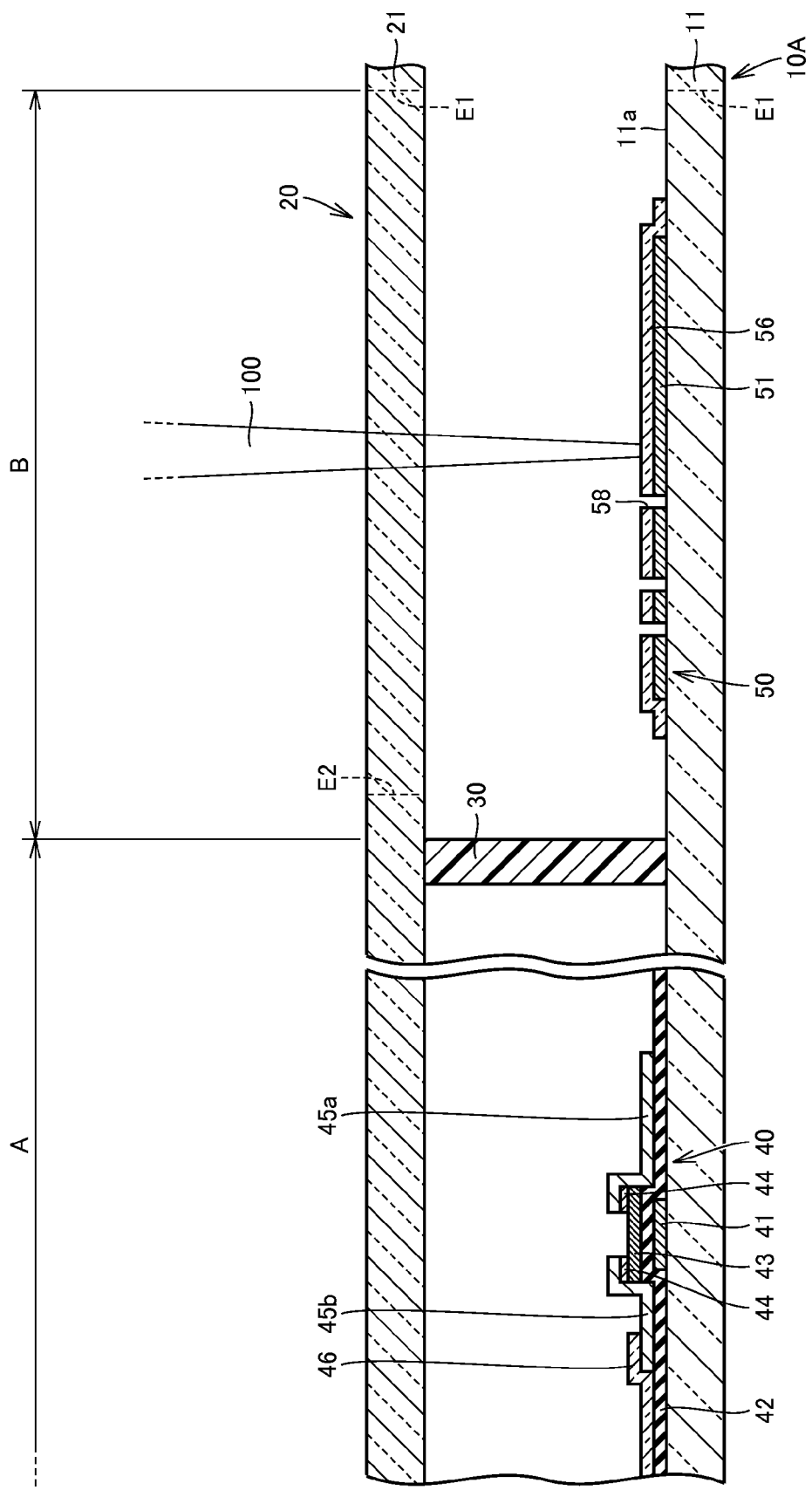
FIG. 7 is a schematic cross-sectional view in the production process in a case where a liquid crystal panel is manufactured according to the method of manufacturing a liquid crystal panel in the first embodiment of the present invention.

In succession, as shown in FIG. 4, a laser marking process is performed by emitting laser beams (step S104). Specifically, as shown in FIG. 7, marking region C in marking pad 50 is irradiated with laser beams 100 through CF substrate 20 from the CF substrate 20 side. For example, fundamentals (having a wavelength of 1064 nm) or the like of $YVO_4$ laser represented by general YAG (yttrium-aluminum-garnet) laser beams or neodymium-added YAG laser beams are suitably made use of as emitted laser beams 100. Thus, upper layer 56 and lower layer 51 constituting marking region C in marking pad 50 in the portion irradiated with laser beams 100 are locally heated and they sublime, so that through hole 58 penetrating upper layer 56 and lower layer 51 is formed.

Thereafter, as shown in FIG. 4, various steps such as the step of pouring liquid crystal 32 are performed (step S105). In succession, TFT substrate 10A and CF substrate 20 are divided along a division line E1 shown in FIG. 7 (step S106) and CF substrate 20 is divided along a division line E2 shown in FIG. 7, to thereby remove an unnecessary portion (step S107). Manufacturing of liquid crystal panel 1A shown in FIGS. 1 and 3 is completed as above.

By manufacturing liquid crystal panel 1A according to the method of manufacturing a liquid crystal panel in the present embodiment described above, marking of high definition can be provided even though marking pad 50 provided on TFT substrate 10A is irradiated with laser beams 100 through CF substrate 20 (that is, the multiple-substrate process is performed). Here, high definition means such definition as suited for a case where information is read by using a reflection camera or a transmission camera, and it specifically means that a shape or a size of through hole 58 formed by irradiation with laser beams 100, a degree of darkening around through hole 58, or the like is suited for detection. Namely, in a case where formed marking is of low definition, reading error of a two-dimensional data code occurs when information is read with a reflection camera or a transmission camera, which is such an error as reading of information different from original information. In a case where formed marking is of high definition as in the present embodiment, however, reading error does not occur and information is correctly read.

Therefore, by manufacturing liquid crystal panel 1A according to the method of manufacturing a liquid crystal panel in the present embodiment, the multiple-substrate process described above can be performed so that two effects of efficient production of liquid crystal panels and reduction in cost obtained by adopting the multiple-substrate process are achieved.

In addition, by manufacturing liquid crystal panel 1A according to the method of manufacturing a liquid crystal panel in the present embodiment, the multiple-substrate process can be adopted while realizing marking of high definition. Therefore, since a space in which liquid crystal 32 is to be sealed in the laser marking process is already in a state isolated from the outside including peripheral portion B by means of sealing member 30, introduction as foreign matters into the space, of various films forming marking region C in marking pad 50 that sublime in the laser marking process can be prevented, and hence yield can also be improved.

Moreover, by implementing the constructions of TFT substrate 10A and liquid crystal panel 1A including the same in the present embodiment, the glass substrate for a liquid crystal panel including marking pad 50 suited for laser marking and the liquid crystal panel including the glass substrate can be obtained. Therefore, by manufacturing liquid crystal panel 1A including TFT substrate 10A, the liquid crystal panel from which various types of information such as serial information and information on use thereof can accurately be read can be obtained.

Though a mechanism with which marking of high definition can be provided according to the method of manufacturing a liquid crystal panel in the present embodiment is unclear, one of the reasons may be as follows. Namely, it is considered that, in a case of a multiple-substrate process according to the conventional method, a TFT substrate and a CF substrate are arranged in proximate to each other with a small gap of approximately 5 µm, which leads to such a situation that an area around a marking pad becomes a substantially hermetically sealed space, a film forming the marking pad is less likely to sublime, and heat generated by irradiation with laser beams is confined in the space, which causes discoloration around the through hole and resulting difficulty in providing marking of high definition. It is considered, however, that, by performing the laser marking process according to the method of manufacturing a liquid crystal panel in the present embodiment, the marking pad is formed of a stack constituted only of a metal film and an ITO film, so that thermal influence on a portion of the marking pad in the vicinity is optimized, sublimation of the metal film and the ITO film constituting the marking pad is promoted, and confinement of heat in the substantially hermetically sealed space is also suppressed, and consequently marking of high definition is realized.

In addition, the present inventor has found that a film construction according to the invention of the present application (that is, a two-layered film construction of metal film/ ITO film) is optimal, by verifying how definition of marking varies if a film construction of a marking pad is variously changed based on adoption of a multiple-substrate process. In verification by prototyping other film constructions (for example, a two-layered film construction of metal film/insulating film, a three-layered film construction of metal film/ insulating film/metal film, a three-layered film construction of metal film/insulating film/ITO film, and the like), satisfactory results could not be obtained in any case.

Second Embodiment

Figure 8:
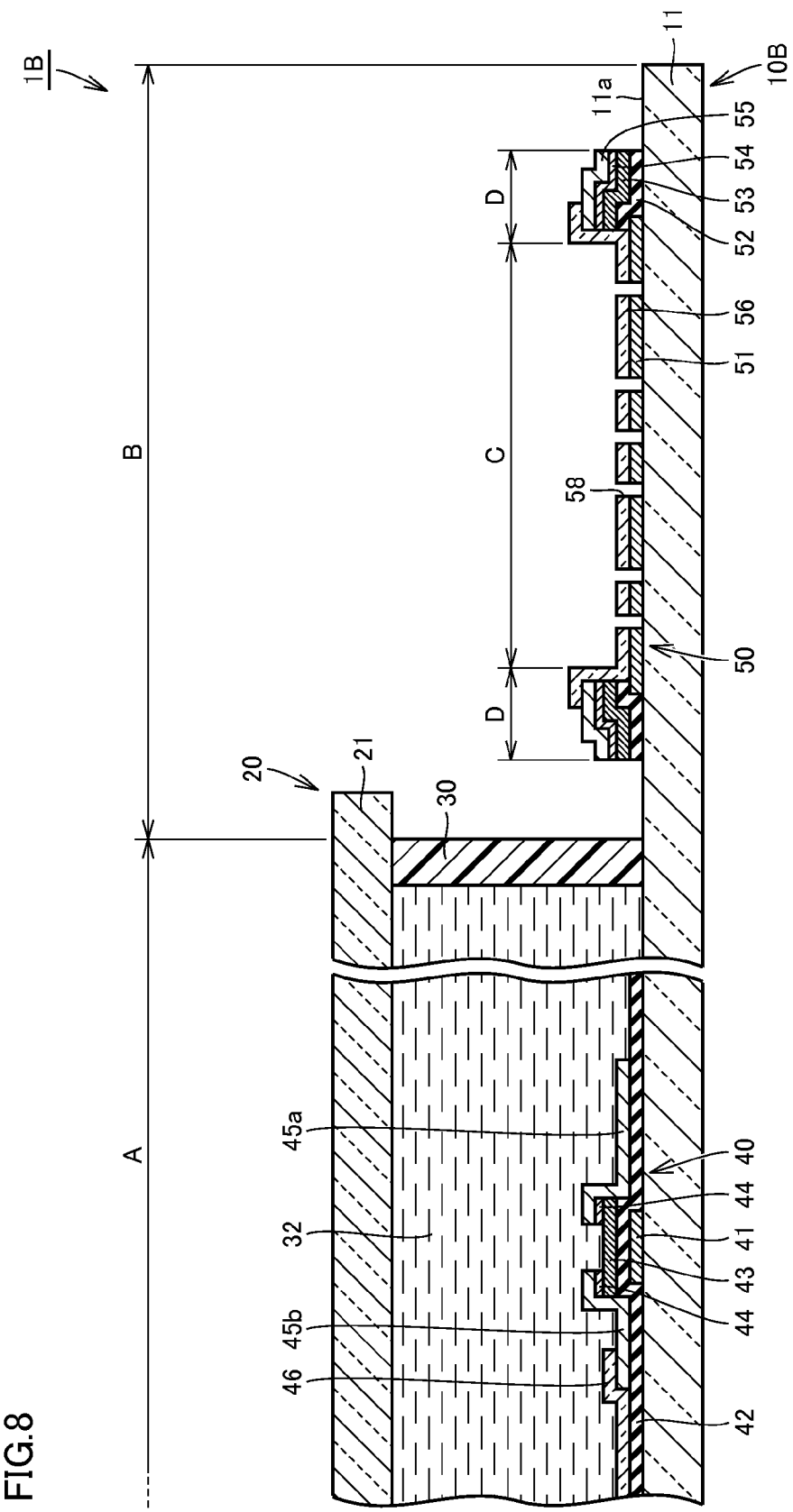
FIG. 8 is a schematic cross-sectional view of a liquid crystal panel in a second embodiment of the present invention.

FIG. 8 is a schematic cross-sectional view of a liquid crystal panel in a second embodiment of the present invention. A structure of a liquid crystal panel and a glass substrate for a liquid crystal panel in the present embodiment will be described with reference to this FIG. 2.

As shown in FIG. 8, a liquid crystal panel 1B in the present embodiment is different from liquid crystal panel 1A in the first embodiment described above only in the construction of marking pad 50. Specifically, marking pad 50 provided on main surface 11a of peripheral portion B of a TFT substrate 10B not serving as the liquid crystal display portion has marking region C in which marking is provided and peripheral region D surrounding marking region C, marking region C is formed of a stack constituted only of a metal film serving as lower layer 51 and an ITO film serving as upper layer 56, a periphery of the metal film serving as lower layer 51 is covered with a protective insulating film 52 in peripheral region D, and further, a first coating film 53 formed from a first semiconductor layer, a second coating film 54 formed from a second semiconductor layer, and a third coating film 55 formed from a metal film are located on protective insulating film 52.

The metal film serving as lower layer 51 is formed from a single-layer metal film made, for example, of aluminum, copper, tantalum, titanium, or the like. A main surface of the metal film serving as lower layer 51 (that is, a surface in contact with upper layer 56) may be subjected to anodization treatment. It is noted that lower layer 51 in marking region C in marking pad 50 and gate electrode 41 of TFT 40 described above are formed simultaneously and a material and a thickness of the former are the same as those of a metal film forming gate electrode 41 of TFT 40.

Upper layer 56 in marking region C in marking pad 50 and the pixel electrode connected to TFT 40 described above are formed simultaneously, and a material and a thickness of the former are the same as those of the ITO film forming pixel electrode 46 connected to TFT 40.

Protective insulating film 52 located in peripheral region D in marking pad 50 and gate insulating film 42 of TFT 40 described above are simultaneously formed, and a material and a thickness of the former are the same as those of gate insulating film 42 of TFT 40.

First coating film 53 and second coating film 54 located in peripheral region D in marking pad 50 as well as first semiconductor layer 43 and second semiconductor layer 44 of TFT 40 described above are simultaneously formed, and a material and a thickness of the former are the same as those of first semiconductor layer 43 and second semiconductor layer 44 of TFT 40 respectively.

Third coating film 55 located in peripheral region D in marking pad 50 as well as source electrode 45a and drain electrode 45b of TFT 40 described above are simultaneously formed, and a material and a thickness of the former are the same as those of source electrode 45a and drain electrode 45b of TFT 40.

Here, a plurality of through holes 58 penetrating the ITO film serving as upper layer 56 and the metal film serving as lower layer 51 are provided in marking region C in marking pad 50. This through hole 58 implements a two-dimensional data code in which various types of information such as serial information and information on use have been coded and the information is read by using a transmission camera or a reflection camera.

FIGS. 9A to 12 are schematic cross-sectional views in a production process in a case where a liquid crystal panel is manufactured according to the method of manufacturing a liquid crystal panel in the present embodiment. The method of manufacturing a liquid crystal panel in the present embodiment is different from the method of manufacturing a liquid crystal panel in the first embodiment described above only in a process of fabricating a TFT substrate. Therefore, since a liquid crystal panel is manufactured in accordance with FIG. 4 referred to in the first embodiment described above, the method of manufacturing a liquid crystal panel in the present embodiment will be described below with reference to FIG. 4 described above and FIGS. 9A to 12.

As shown in FIG. 4, in the method of manufacturing a liquid crystal panel in the present embodiment, initially, fabrication of TFT substrate 10B (step S101) and fabrication of CF substrate 20 paired with TFT substrate 10B (step S102) are concurrently performed. In fabricating CF substrate 20, it is fabricated by preparing glass substrate 21, bonding a color film thereto and forming counter electrodes, and further forming an orientation film. In fabricating TFT substrate 10B, specifically, the following process is performed.

Figure 9A:
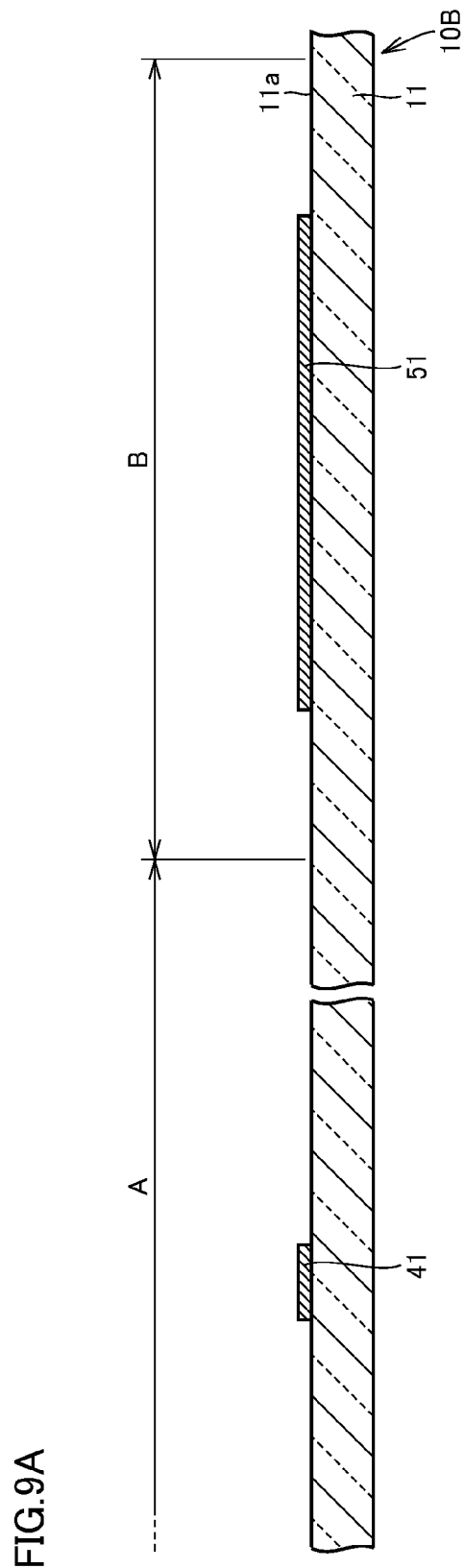
FIG. 9A is a schematic cross-sectional view in a production process in a case where a liquid crystal panel is manufactured according to a method of manufacturing a liquid crystal panel in the second embodiment of the present invention.

Initially, as shown in FIG. 9A, glass substrate 11 including portion A serving as the liquid crystal display portion and peripheral portion B not serving as the liquid crystal display portion is prepared and a metal film is formed thereon and patterned. Thus, gate electrode 41 of TFT 40 is formed in portion A serving as the liquid crystal display portion and lower layer 51 in marking pad 50 is formed in peripheral portion B. More specifically, an aluminum film is formed on main surface 11a of glass substrate 11, for example, with sputtering, and the aluminum film is patterned with photolithography to thereby form gate electrode 41 and lower layer 51. It is noted that dry etching using, for example, $BCl_3+Cl_2$, $CF_4(+O_2)$ or the like can be made use of as an etching process in photolithography. Here, the main surface of the formed aluminum film may be subjected to anodization treatment as required.

Figure 9B:
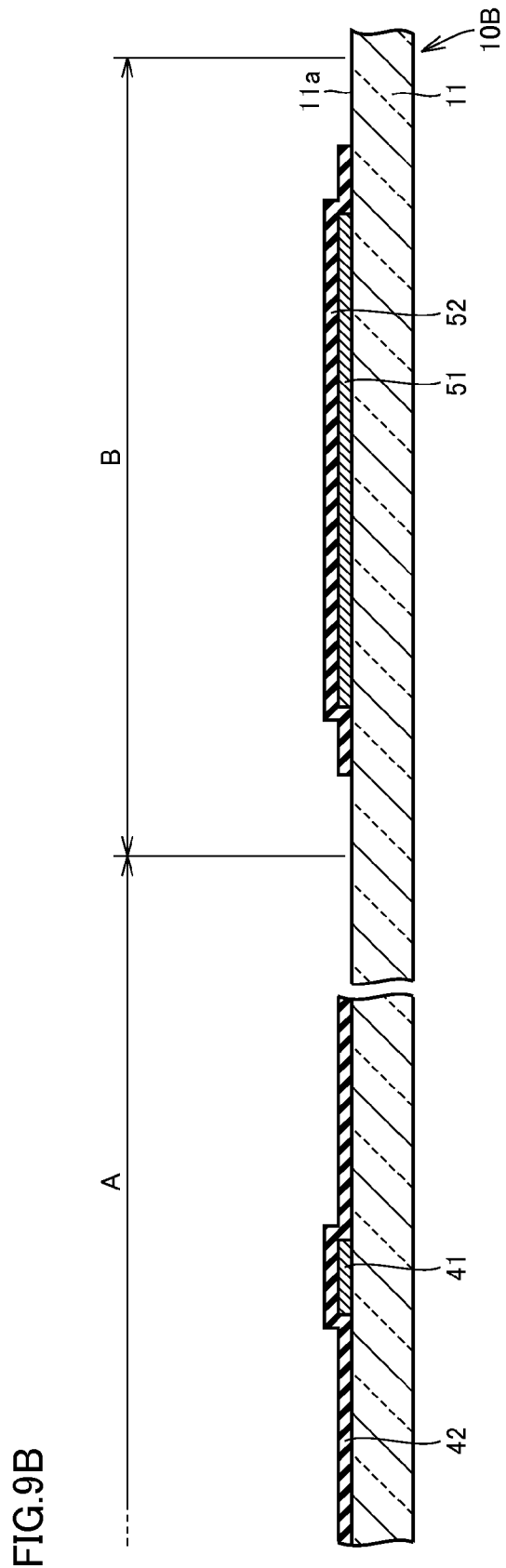
FIG. 9B is a schematic cross-sectional view in the production process in a case where a liquid crystal panel is manufactured according to the method of manufacturing a liquid crystal panel in the second embodiment of the present invention.

Then, as shown in FIG. 9B, an insulating film is formed on main surface 11a of glass substrate 11 and patterned. Thus, gate insulating film 42 of TFT 40 is formed in portion A serving as the liquid crystal display portion and protective insulating film 52 in marking pad 50 is formed in peripheral portion B. More specifically, a silicon nitride film is formed on main surface 11a of glass substrate 11, for example, with PECVD, and the silicon nitride film is patterned with photolithography to thereby form gate insulating film 42 and protective insulating film 52.

Then, as shown in FIG. 10A, an amorphous silicon layer is formed on main surface 11a of glass substrate 11 and patterned or the like. Thus, first semiconductor layer 43 and second semiconductor layer 44 are formed in portion A serving as the liquid crystal display portion and the first semiconductor layer serving as first coating film 53 and the second semiconductor layer serving as second coating film 54 are formed in peripheral portion B. Here, second semiconductor layer 44 and second coating film 54 are in such a shape as covering the entire main surface of first semiconductor layer 43 and the entire main surface of first coating film 53, respectively, and they are formed by implanting ions into an upper portion of the amorphous silicon layer by making use of an ion implantation method as appropriate. It is noted that dry etching using, for example, $CF_4+O_2$, $CCl_4+O_2$, $SF_6$, or the like can be made use of as an etching process in patterning.

Then, as shown in FIG. 10A, a metal film is formed on main surface 11a of glass substrate 11 and patterned. Thus, source electrode 45a and drain electrode 45b of TFT 40 are formed in portion A serving as the liquid crystal display portion and third coating film 55 is formed in peripheral portion B. More specifically, an aluminum film is formed on main surface 11a of glass substrate 11, for example, with sputtering, and the aluminum film is patterned with photolithography to thereby form source electrode 45a, drain electrode 45b, and third coating film 55. It is noted that dry etching using, for example, $BCl_3+Cl_2$, $CF_4(+O_2)$ or the like can be made use of as an etching process in photolithography.

Then, as shown in FIG. 10A, using source electrode 45a and drain electrode 45b as a mask, second semiconductor layer 44 is etched and patterned, so that a channel portion is formed in first semiconductor layer 43. It is noted that dry etching using, for example, $CF_4+O_2$, $CCl_4+O_2$, $SF_6$, or the like can be made use of as an etching process in patterning.

Then, as shown in FIG. 10B, a portion corresponding to marking region C in protective insulating film 52 and first to third coating films 53 to 55 formed in peripheral portion B is etched away, to thereby form a recess 57 having the main surface of the metal film serving as lower layer 51 as a bottom surface. Thus, the main surface of lower layer 51 in the portion corresponding to marking region C is exposed.

Then, as shown in FIG. 11A, an ITO film is formed on main surface 11a of glass substrate 11 and patterned, so that pixel electrode 46 electrically connected to TFT 40 is formed in portion A serving as the liquid crystal display portion and upper layer 56 in marking pad 50 is formed in peripheral portion B. More specifically, the ITO film is formed on glass substrate 11, for example, with sputtering, and the ITO film is patterned with photolithography to thereby form pixel electrode 46 and upper layer 56. It is noted that wet etching using, for example, $HCl+HNO_3$ or the like can be made use of as an etching process in photolithography.

Thereafter, an orientation film is formed on main surface 11a of portion A of glass substrate 11 serving as the liquid crystal display portion. Fabrication of TFT substrate 10B is completed as above.

Figure 11B:
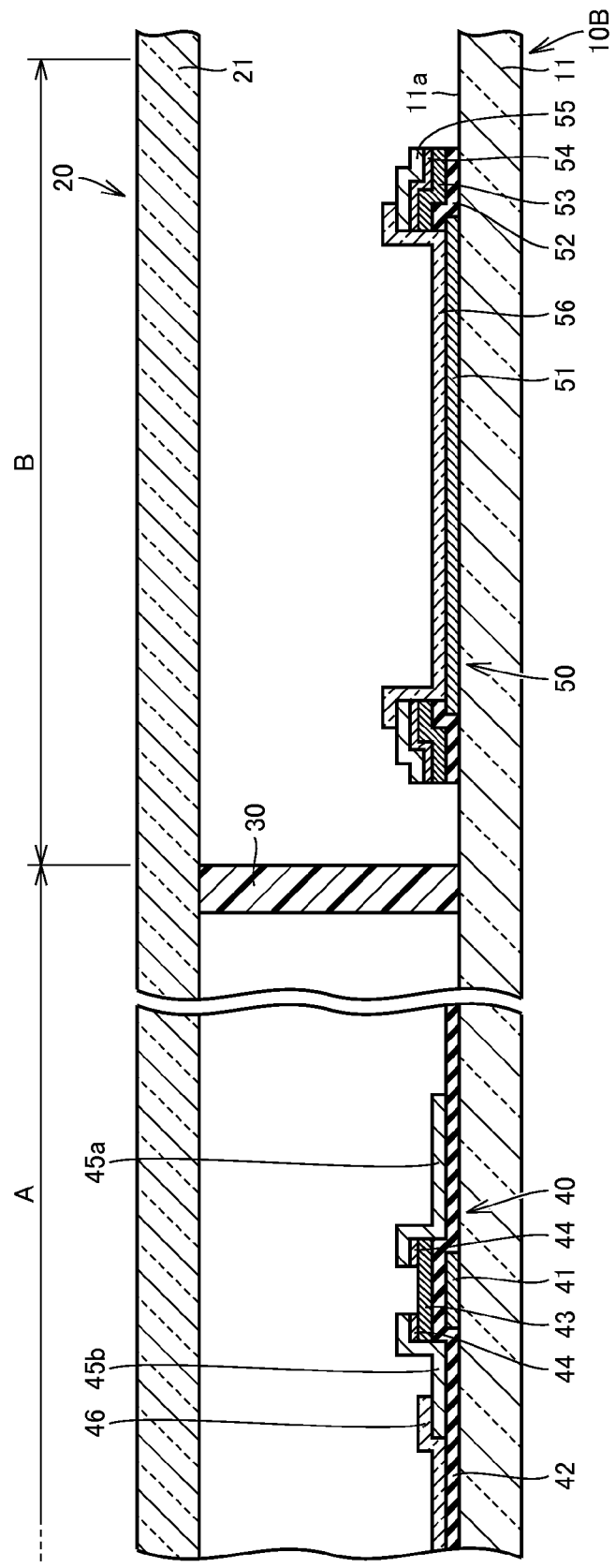
FIG. 11B is a schematic cross-sectional view in the production process in a case where a liquid crystal panel is manufactured according to the method of manufacturing a liquid crystal panel in the second embodiment of the present invention.

In succession, as shown in FIG. 4, TFT substrate 10B fabricated in step S101 and CF substrate 20 fabricated in step S102 are bonded to each other (step S103). Specifically, as shown in FIG. 11B, sealing member 30 is arranged to surround portion A of TFT substrate 10B serving as the liquid crystal display portion, CF substrate 20 is positioned in contact with this sealing member 30 to be arranged opposed to TFT substrate 10B, and sealing member 30 is cured. Thus, TFT substrate 10B and CF substrate 20 are bonded to each other. Here, a thermosetting sealing material, a photo-curing sealing material, combination thereof, or the like can be made use of as sealing member 30 to be used.

In the method of manufacturing a liquid crystal panel in the present embodiment, both of glass substrate 11 serving as a base member for TFT substrate 10B and glass substrate 21 serving as a base member for CF substrate 20 are fabricated from a mother glass substrate. Therefore, after CF substrate 20 is bonded to TFT substrate 10B, a portion of CF substrate 20 not serving as the liquid crystal display portion is located opposed to peripheral portion B of TFT substrate 10B not serving as the liquid crystal display portion. Namely, CF substrate 20 is arranged opposed to the main surface of marking region C in marking pad 50 formed in peripheral portion B of TFT substrate 10B not serving as the liquid crystal display portion, at a distance therefrom.

Figure 12:
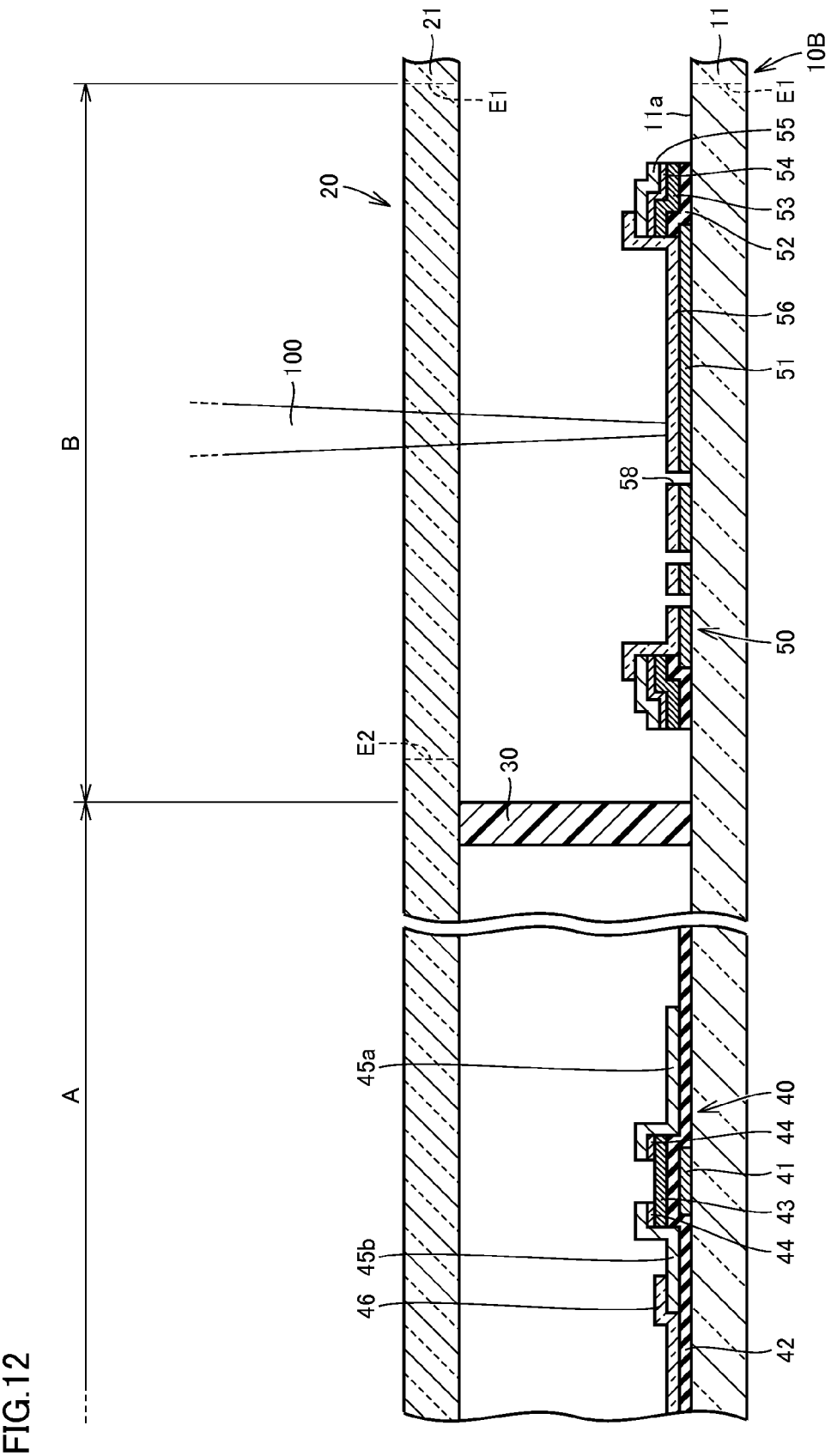
FIG. 12 is a schematic cross-sectional view in the production process in a case where a liquid crystal panel is manufactured according to the method of manufacturing a liquid crystal panel in the second embodiment of the present invention.

In succession, as shown in FIG. 4, a laser marking process is performed by emitting laser beams (step S104). Specifically, as shown in FIG. 12, marking region C in marking pad 50 is irradiated with laser beams 100 through CF substrate 20 from the CF substrate 20 side. For example, fundamentals (having a wavelength of 1064 nm) or the like of $YVO_4$ laser represented by general YAG laser beams or neodymium-added YAG laser beams are suitably made use of as emitted laser beams 100. Thus, upper layer 56 and lower layer 51 constituting marking region C in marking pad 50 in the portion irradiated with laser beams 100 are locally heated and they sublime, so that through hole 58 penetrating upper layer 56 and lower layer 51 is formed.

Thereafter, as shown in FIG. 4, various steps such as the step of pouring liquid crystal 32 are performed (step S105). In succession, TFT substrate 10B and CF substrate 20 are divided along division line E1 shown in FIG. 12 (step S106) and CF substrate 20 is divided along division line E2 shown in FIG. 12, to thereby remove an unnecessary portion (step S107). Manufacturing of liquid crystal panel 1B shown in FIG. 8 is completed as above.

By manufacturing liquid crystal panel 1B according to the method of manufacturing a liquid crystal panel in the present embodiment described above, as in the first embodiment described above, marking of high definition can be provided even though marking pad 50 provided on TFT substrate 10B is irradiated with laser beams 100 through CF substrate 20 (that is, the multiple-substrate process is performed). Therefore, by manufacturing liquid crystal panel 1B according to the method of manufacturing a liquid crystal panel in the present embodiment, the multiple-substrate process described above can be performed so that two effects of efficient production of liquid crystal panels and reduction in cost obtained by adopting the multiple-substrate process are achieved.

In addition, by manufacturing liquid crystal panel 1B according to the method of manufacturing a liquid crystal panel in the present embodiment, as in the first embodiment described above, the multiple-substrate process can be adopted while realizing marking of high definition. Therefore, since a space in which liquid crystal 32 is to be sealed in the laser marking process is already in a state isolated from the outside including peripheral portion B by means of sealing member 30, introduction as foreign matters into the space, of various films forming marking region C in marking pad 50 that sublime in the laser marking process can be prevented, and hence yield can also be improved.

Moreover, by manufacturing liquid crystal panel 1B according to the method of manufacturing a liquid crystal panel in the present embodiment, the metal film serving as lower layer 51 in marking pad 50 that has already been formed can always be protected by protective insulating film 52 during an etching process or a film deposition process performed on TFT substrate 10B for fabricating TFT 40. Therefore, corrosion and deterioration of lower layer 51 in marking pad 50 during the etching process or the film deposition process can reliably be prevented.

Further, by implementing the constructions of TFT substrate 10B and liquid crystal panel 1B including the same in the present embodiment, as in the first embodiment described above, the glass substrate for a liquid crystal panel including marking pad 50 suited for laser marking and the liquid crystal panel including the glass substrate can be obtained. Therefore, by manufacturing liquid crystal panel 1B including TFT substrate 10B, the liquid crystal panel from which various types of information such as serial information and information on use thereof can accurately be read can be obtained.

(Variation)

Figure 13:
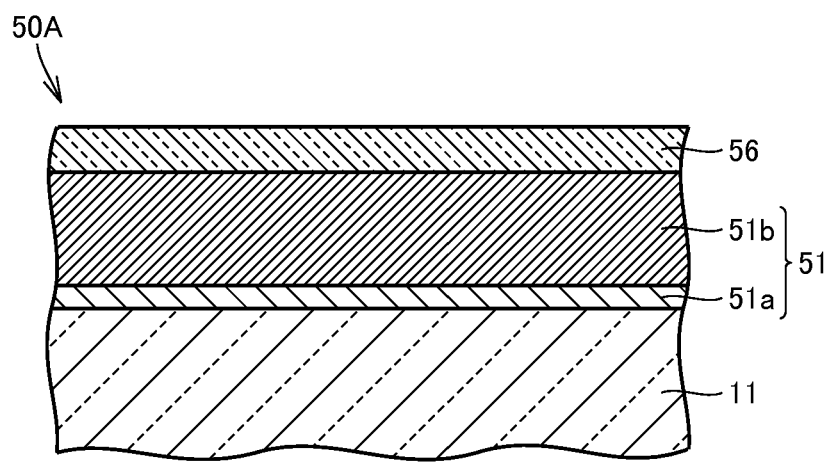
FIG. 13 is a schematic cross-sectional view of a marking pad according to a first variation.
Figure 14:
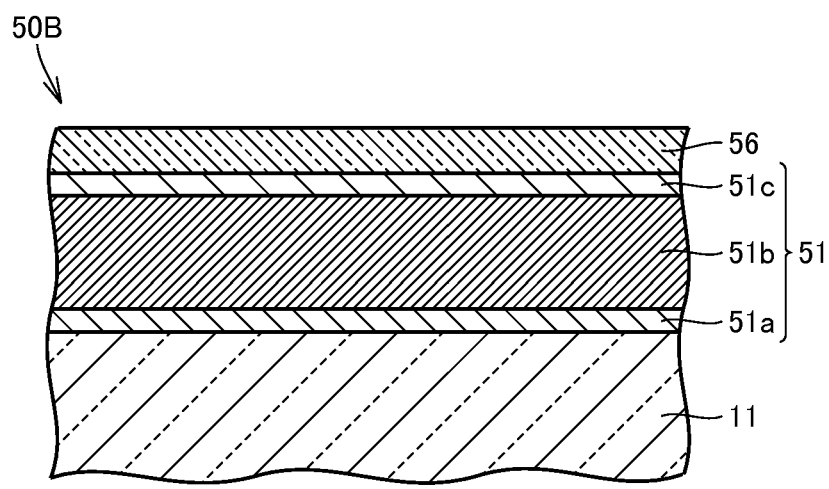
FIG. 14 is a schematic cross-sectional view of a marking pad according to a second variation.

FIGS. 13 and 14 are schematic cross-sectional views of marking pads according to first and second variations, respectively. In both of marking pads 50A and 50B according to these first and second variations, a metal film forming lower layer 51 in marking region C in marking pad 50 in the first and second embodiments described above is formed from a film stack.

As shown in FIG. 13, in the first variation, lower layer 51 in marking region C in marking pad 50A is formed, for example, from a two-layered film stack of a first metal film 51a and a second metal film 51b formed to cover a main surface of first metal film 51a. First metal film 51a and second metal film 51b are formed by successively forming metal films different in material with sputtering or the like, in forming lower layer 51 in marking pad 50A. In this case, a main surface of second metal film 51b may be subjected to anodization treatment.

For example, a tantalum film is suitably made use of as first metal film 51a, and for example, an aluminum film or a copper film is suitably made use of as second metal film 51b. In this case as well, lower layer 51 in marking region C in marking pad 50A formed from the two-layered film stack and gate electrode 41 of TFT 40 described above are preferably simultaneously formed, and in that case, the metal film forming gate electrode 41 of TFT 40 is also formed as the two-layered film stack having the construction described above.

As shown in FIG. 14, in the second variation, lower layer 51 in marking region C in marking pad 50B is formed, for example, from a three-layered film stack of first metal film 51a, second metal film 51b formed to cover a main surface of first metal film 51a, and a third metal film 51c formed to cover a main surface of second metal film 51b. First metal film 51a, second metal film 51b and third metal film 51c are formed by successively forming metal films different in material with sputtering or the like, in forming lower layer 51 in marking pad 50B. In this case, a main surface of third metal film 51c may be subjected to anodization treatment.

For example, a tantalum film is suitably made use of as first metal film 51a, for example, an aluminum film or a copper film is suitably made use of as second metal film 51b, and for example, a tantalum film is suitably made use of as third metal film 51c. In this case as well, lower layer 51 in marking region C in marking pad 50B formed from the three-layered film stack and gate electrode 41 of TFT 40 described above are preferably simultaneously formed, and in that case, the metal film forming gate electrode 41 of TFT 40 is also formed as the three-layered film stack having the construction described above.

According to the first and second variations described above as well, effects the same as in the first and second embodiments described above can be obtained.

Figure 15A:
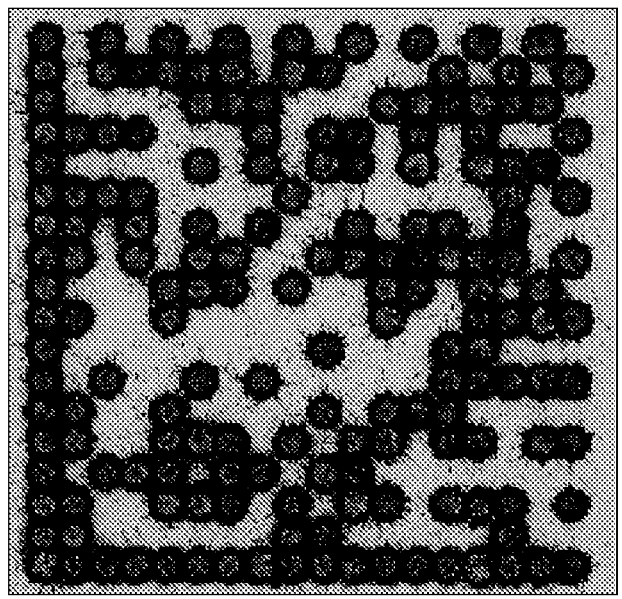
FIG. 15A is an enlarged photograph showing one example of a marking pad subjected to a laser marking process in a multiple-substrate process with the present invention being applied.
Figure 15B:
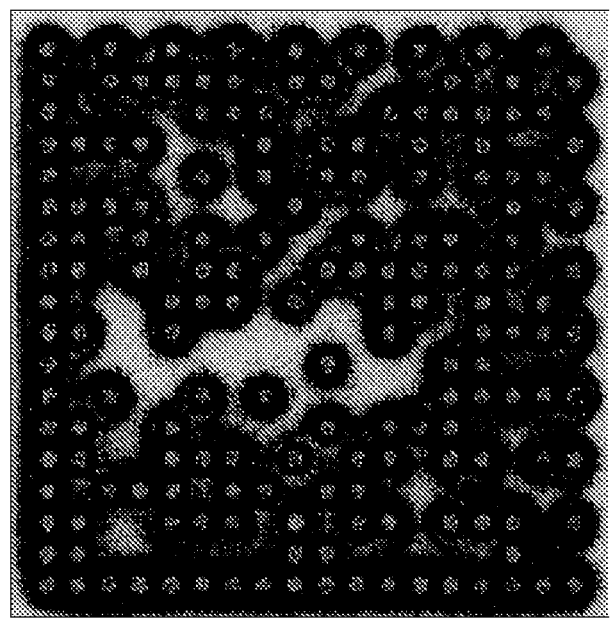
FIG. 15B is an enlarged photograph showing one example of a marking pad subjected to a laser marking process in a multiple-substrate process without the present invention being applied.

FIG. 15A is an enlarged photograph showing one example of a marking pad subjected to a laser marking process in a multiple-substrate process with the present invention being applied, and FIG. 15B is an enlarged photograph showing one example of a marking pad subjected to a laser marking process in a multiple-substrate process without the present invention being applied. Referring to these enlarged photographs, it is understood that, even in a case where the multiple-substrate process is adopted, marking definition such as a size and a shape of a through hole and a degree of darkening around the through hole can be maintained high by applying the present invention, whereas marking definition becomes low when the present invention is not applied.

It should be understood that each of the embodiments and the variations disclosed herein is illustrative and non-restrictive in every respect. The technical scope of the present invention is defined by the claims, and is intended to include any modifications within the scope and meaning equivalent to the terms of the claims.

REFERENCE SIGNS LIST

1A, 1B liquid crystal panel; 2 information recording portion; 10A, 10B TFT substrate; 11 glass substrate; 11a main surface; 20 CF substrate; 21 glass substrate; 30 sealing member; 32 liquid crystal; 40 TFT; 41 gate electrode; 42 gate insulating film; 43 first semiconductor layer; 44 second semiconductor layer; 45*a* source electrode; 45*b* drain electrode; 46 pixel electrode; 50, 50A, 50B marking pad; 51 lower layer; 51*a* first metal film; 51*b* second metal film; 51*c* third metal film; 52 protective insulating film; 53 first coating film; 54 second coating film; 55 third coating film; 56 upper layer; 57 recess; 58 through hole; 60 character data portion; 100 laser beam; A portion serving as liquid crystal display portion; B peripheral portion; C marking region; D peripheral region; and E1, E2 division line.

The invention claimed is:

1. A method of manufacturing a liquid crystal panel, comprising the steps of:
    preparing a first liquid crystal panel glass substrate including a portion serving as a liquid crystal display portion and a peripheral portion not serving as the liquid crystal display portion;
    providing a marking pad including a marking region formed of a stack constituted only of a metal film and an ITO film on a main surface of said peripheral portion of said first liquid crystal panel glass substrate;
    bonding a second liquid crystal panel glass substrate paired with said first liquid crystal panel glass substrate to said first liquid crystal panel glass substrate so as to be opposed to a main surface of the marking region in said marking pad at a distance therefrom; and
    providing marking by providing a through hole penetrating said ITO film and said metal film in the marking region in said marking pad by irradiating the marking region in said marking pad with laser beams through said second liquid crystal panel glass substrate.

2. The method of manufacturing a liquid crystal panel according to claim 1, wherein
    said step of providing a marking pad includes the steps of forming said metal film on the main surface of said peripheral portion of said first liquid crystal panel glass substrate and forming said ITO film in contact with said metal film so as to cover a main surface and a periphery of said metal film.

3. The method of manufacturing a liquid crystal panel according to claim 1, wherein
    said step of providing a marking pad includes the steps of forming said metal film on the main surface of said peripheral portion of said first liquid crystal panel glass substrate, forming an insulating film in contact with said metal film so as to cover a main surface and a periphery of said metal film, removing a part of said insulating film such that the main surface of said metal film is exposed and the periphery of said metal film is covered with said insulating film, and forming said ITO film in contact with said metal film so as to cover the main surface of said metal film exposed as a result of removal of the part of said insulating film.

4. The method of manufacturing a liquid crystal panel according to claim 3, wherein
    in said step of forming an insulating film in said step of providing a marking pad, an insulating film serving as a gate insulating film of a TFT is simultaneously formed in said portion serving as the liquid crystal display portion of said first liquid crystal panel glass substrate.

5. The method of manufacturing a liquid crystal panel according to claim 2, wherein
    in said step of forming said metal film in said step of providing a marking pad, a metal film serving as a gate electrode of a TFT is simultaneously formed in said portion serving as the liquid crystal display portion of said first liquid crystal panel glass substrate.

6. The method of manufacturing a liquid crystal panel according to claim 2, wherein
    in said step of forming said ITO film in said step of providing a marking pad, an ITO film serving as a pixel electrode is simultaneously formed in said portion serving as the liquid crystal display portion of said first liquid crystal panel glass substrate.

7. The method of manufacturing a liquid crystal panel according to claim 2, wherein
    said step of forming said metal film in said step of providing a marking pad includes the step of successively stacking and forming a plurality of films different in material.

8. The method of manufacturing a liquid crystal panel according to claim 1, further comprising the step of subjecting a surface of the metal film serving as the marking region in said marking pad to anodization treatment.

* * * * *